(12) United States Patent
Katsumata et al.

(10) Patent No.: US 11,451,738 B2
(45) Date of Patent: Sep. 20, 2022

(54) RECORDING APPARATUS, METHOD OF CONTROLLING RECORDING APPARATUS, AND STORAGE MEDIUM

(71) Applicant: CANON KABUSHIKI KAISHA, Tokyo (JP)

(72) Inventors: Kohei Katsumata, Kanagawa (JP); Takashi Hasegawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 18 days.

(21) Appl. No.: 17/103,395

(22) Filed: Nov. 24, 2020

(65) Prior Publication Data

US 2021/0168325 A1    Jun. 3, 2021

(30) Foreign Application Priority Data

Nov. 29, 2019 (JP) .............................. JP2019-217575
Nov. 29, 2019 (JP) .............................. JP2019-217576

(51) Int. Cl.
*H04N 5/77* (2006.01)
*H04N 5/232* (2006.01)

(52) U.S. Cl.
CPC .......... *H04N 5/77* (2013.01); *H04N 5/23245* (2013.01)

(58) Field of Classification Search
CPC ........ H04N 5/77; H04N 5/23245; H04N 5/76; H04N 5/91; G11C 16/22; G11C 16/3418; G11C 16/10; G11C 16/26; G11C 7/04; G11B 27/36; G06F 1/206
See application file for complete search history.

(56) References Cited

U.S. PATENT DOCUMENTS

2010/0235012 A1    9/2010    Cox

FOREIGN PATENT DOCUMENTS

| CN | 105824582 A | * | 8/2016 | ............. G06F 3/061 |
|---|---|---|---|---|
| EP | 3786804 A1 | | 3/2021 | |
| JP | 2017-005323 A | | 1/2017 | |
| WO | 2015/183586 A1 | | 12/2015 | |

OTHER PUBLICATIONS

Machine English Translation of CN 105824582 A, Aug. 3, 2016 (Year: 2016).*
NVM Express, Inc. "NVM Express Revsion 1.3", 2017, p. 6, 121, 159, 232-234.

* cited by examiner

*Primary Examiner* — Nelson D. Hernández Hernández
(74) *Attorney, Agent, or Firm* — Canon U.S.A., Inc. IP Division

(57) ABSTRACT

A recording apparatus configured to access a recording medium includes a controller that sets a temperature threshold value for execution of function limitation on the recording medium to the recording medium, wherein, based on an operation state of the recording apparatus, the controller selects whether to execute a first setting to set the temperature threshold value to a specific value or a second setting to set the temperature threshold value to a value greater than the specific value.

20 Claims, 5 Drawing Sheets

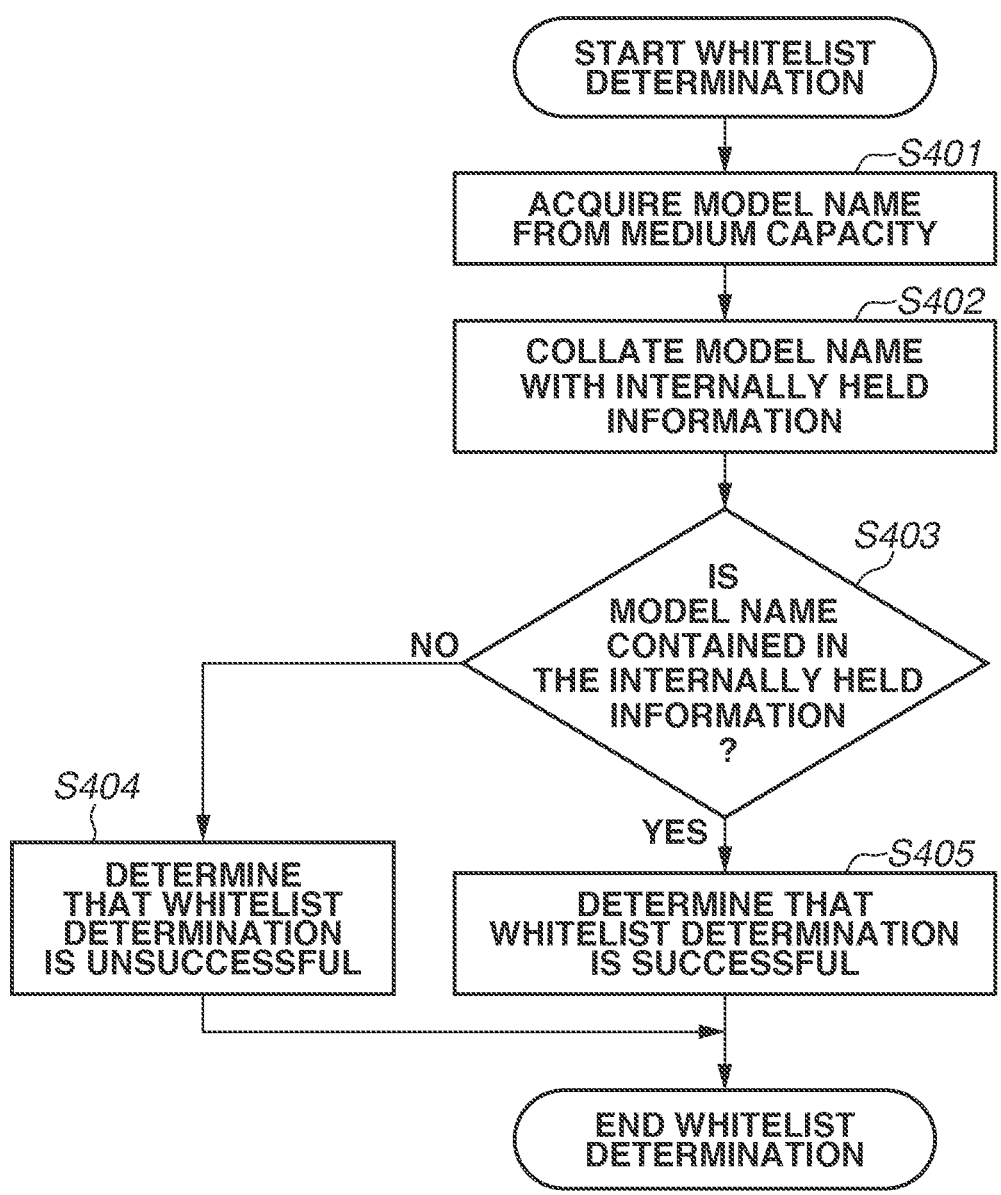

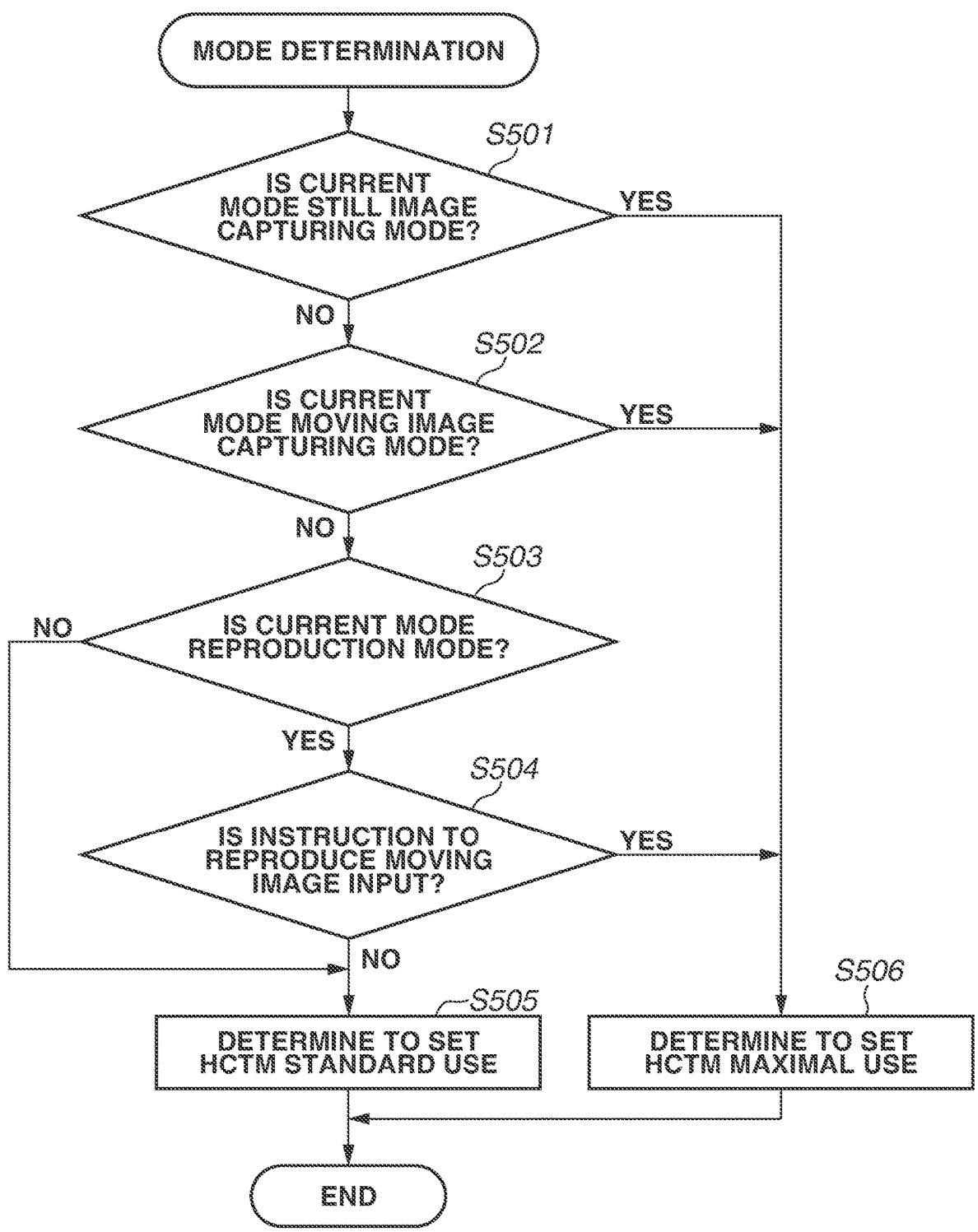

RECORDING APPARATUS, METHOD OF CONTROLLING RECORDING APPARATUS, AND STORAGE MEDIUM

BACKGROUND

Field

The present disclosure relates to recording apparatuses configured to access a recording medium and methods of controlling a recording apparatus.

Description of the Related Art

Flash memory cards are widely used as a recording medium of an image capturing apparatus. In recent years, there are demands for improved performance in writing/reading rates with respect to a flash memory card. At the same time, flash memory cards of current physical memory sizes or smaller are demanded from the market. Realizing improved performance with respect to a flash memory card often results in an increase in power and heat/temperature, and realizing size reduction often results in difficulties in heat release.

The temperature rise causes overheating in hardware components that exceeds an operation guarantee temperature, and this leads to trouble and failures. As a result, user-recorded content may no longer be viewable due to recording medium breakage.

Japanese Patent Laid-Open No. 2017-5323 discusses a technique for avoiding heating caused by a temperature rise. Specifically, an outside temperature is detected, and dynamic rate control is performed based on the detected outside temperature.

There is also a technique referred to as "thermal throttling", which is a technique for reducing trouble and failures originating from overheating. In thermal throttling, a recording medium stores its own temperature threshold value in a flash memory, and in a case where a value acquired from an internal thermometer of the recording medium reaches or exceeds the temperature threshold value, function limitation such as access rate limitation is executed to prevent the temperature from reaching or exceeding the threshold value.

With this technique, the hardware components in the recording medium are maintained at the operation guarantee temperature even under a severe environment, the reliability of the recorded content is secured and, the lifetime of the recording medium is extended.

Thermal throttling (preventing a temperature rise by function limitation) has a disadvantage in that the writing/reading rates decrease. This is due to a flash memory card characteristic that the writing/reading rates and heat/power increases are proportional. If thermal throttling is executed, writing/reading rates limitation is executed until the recording medium temperature decreases to a threshold value for cancellation. Then, if the recording medium temperature becomes less than or equal to the threshold value for cancellation, the thermal throttling is cancelled, and the writing/reading rates limitation is cancelled and the writing/reading rates are restored to writing/reading rates for pursuing a normal top speed.

In CFexpress standards for recording media, a host controlled thermal management (HCTM) function for thermal throttling is prepared. In the HCTM function, a temperature threshold value for execution of thermal throttling can be set by a host.

In the HCTM function, for example, the temperature threshold value is set to an upper limit of settable temperatures to control thermal throttling to be executed less often.

In the case where the temperature threshold value is set to the upper limit of settable temperatures by the HCTM function so that thermal throttling is executed less often, data is recorded/read at high speed even when the top speed is not needed. Thus, a temperature rise often occurs. When a temperature rise occurs and the recording medium temperature reaches the upper limit, writing and reading to and from the recording medium are substantially no longer executable. Thus, writing and reading cannot be executed until the recording medium temperature decreases, and image capturing (recording) and image reproduction cannot be executed. Thus, for example, an opportunity to capture an image may be missed.

SUMMARY

The present disclosure is directed to a recording apparatus configured to set a temperature for execution of function limitation on a recording medium as appropriate.

According to an aspect of the present disclosure, a recording apparatus is configured to access a recording medium, the recording apparatus comprising a controller configured to set a temperature threshold value for execution of function limitation on the recording medium to the recording medium, wherein, based on an operation state of the recording apparatus, the controller selects whether to execute a first setting to set the temperature threshold value to a specific value or a second setting to set the temperature threshold value to a value greater than the specific value, based on an operation state of the recording apparatus.

According to another aspect of the present disclosure, a method of controlling a recording apparatus configured to access a recording medium comprises performing control to set a temperature threshold value for execution of function limitation on the recording medium to the recording medium, wherein, based on an operation state of the recording apparatus, the control includes selecting whether to execute a first setting to set the temperature threshold value to a specific value or a second setting to set the temperature threshold value to a value greater than the specific value.

Further features will become apparent from the following description of exemplary embodiments with reference to the attached drawings.

BRIEF DESCRIPTION OF THE DRAWINGS

FIG. 4 is a flowchart illustrating a whitelist determination process.

FIG. 5 is a flowchart illustrating a mode determination process.

DESCRIPTION OF THE EMBODIMENTS

Figure 1:
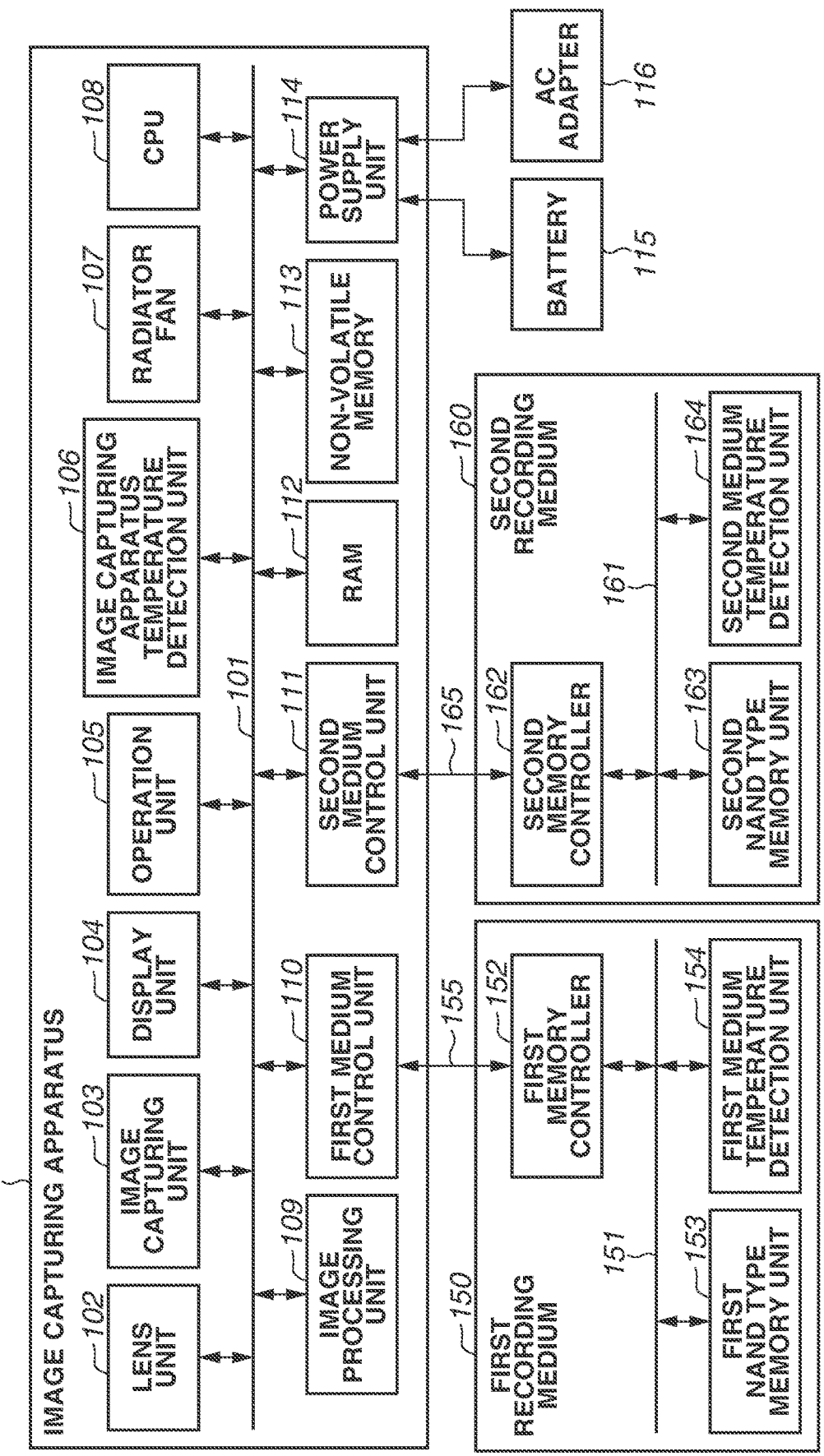
FIG. 1 schematically illustrates a configuration of an image capturing apparatus 100.

Various exemplary embodiments will be described in detail below with reference to the attached drawings. It should be noted that the exemplary embodiments disclosed herein are not intended to limit the scope of the claimed invention. While a plurality of features is described in the exemplary embodiments, not every one of the plurality of features is always essential, and the plurality of features can be combined as desired. Configurations that are the same or similar are given the same reference numeral in the attached drawings, and repetition of a description is avoided.

<Configuration of Image Capturing Apparatus>

FIG. 1 schematically illustrates a configuration of an image capturing apparatus 100, which is an example of a recording apparatus.

In FIG. 1, a lens unit 102, an image capturing unit 103, a display unit 104, an operation unit 105, an image capturing apparatus temperature detection unit 106, a radiator fan 107, and a central processing unit (CPU) 108 are connected to an internal bus 101 of the image capturing apparatus 100. An image processing unit 109, a first medium control unit 110, a second medium control unit 111, a random access memory (RAM) 112, a non-volatile memory 113, and a power supply unit 114 are connected to the internal bus 101. The components connected to the internal bus 101 are configured to exchange data with one another via the internal bus 101.

The CPU 108 controls the components of the image capturing apparatus 100 based on, for example, a program stored in the non-volatile memory 113 and using the RAM 112 as a work memory.

The non-volatile memory 113 stores image data, audio data, other data, and various programs for operations of the CPU 108. The non-volatile memory 113 is, for example, a hard disk (HD) or read-only memory (ROM).

The image processing unit 109 performs various types of image processing on image data stored in the non-volatile memory 113 or the RAM 112 and image data acquired by capturing an optical subject image having entered through the lens unit 102 with the image capturing unit 103 based on control by the CPU 108. The types of image processing that are performed by the image processing unit 109 include analog/digital (A/D) conversion processing, digital/analog (D/A) conversion processing, image data encoding processing, compression processing, decoding processing, enlargement/reduction processing (resizing), noise reduction processing, and color conversion processing. The image processing unit 109 can include a dedicated circuit block configured to perform a specific type of image processing. Some types of image processing can be performed by the CPU 108 based on a program without using the image processing unit 109.

The display unit 104 displays an image and a graphical user interface (GUI) screen of a GUI based on control by the CPU 108. The CPU 108 controls the components of the image capturing apparatus 100 to generate a display control signal based on a program, generate a video signal to be displayed on the display unit 104, and output the generated video signal. The display unit 104 displays a video image based on the output video signal. Alternatively, the image capturing apparatus 100 can include an interface configured to output a video signal to be displayed on the display unit 104, and the display unit 104 can be an external monitor (television).

The operation unit 105 is an input device configured to receive user operations and includes a touch panel, a power button, a shutter button, a mode selection dial, a cross key, an operation dial, and a menu button. The touch panel is an input device that is placed on the display unit 104 and outputs coordinate information corresponding to a touched position.

The power supply unit 114 includes power input terminals to attach a battery 115 and an alternating current (AC) adapter 116. The power supply unit 114 selects the battery 115 or the AC adapter 116, whichever has a higher voltage, or the power supply unit 114 preferentially selects the AC adapter 116 as a power source using a power selection circuit including a comparator and a load switch.

The power supply unit 114 includes a battery interface configured to connect the image capturing apparatus 100 and the battery 115. The battery interface includes a power source, a ground, a communication terminal for communication with an internal microcomputer (not illustrated) of the battery 115, and a temperature detection unit (not illustrated) for detection of an internal temperature of the battery 115. The power supply unit 114 also includes an AC adapter interface configured to connect the image capturing apparatus 100 and the AC adapter 116. The AC adapter interface includes a detection unit configured to detect a power source, a ground, and the AC adapter 116.

The power supply unit 114 notifies the CPU 108 of information about the battery 115 and the AC adapter 116 via the internal bus 101. The power supply unit 114 regulates the voltage of the selected power source using a direct-current/direct-current (DC/DC) converter (not illustrated) or a series regulator (not illustrated) and supplies power to the components of the image capturing apparatus 100. The power supply unit 114 A/D converts voltage of the battery 115 and voltage of the AC adapter 116 being attached and notifies the CPU 108 of the converted value.

The image capturing unit 103 is an image sensor such as a charge-coupled device (CCD) sensor or a complementary metal oxide semiconductor (CMOS) sensor. The lens unit 102 includes a zoom lens, a focus lens, a shutter, a diaphragm, a ranging unit, and an A/D converter.

The image capturing unit 103 captures still images and moving images. Captured image data is transmitted to the image processing unit 109, and the image processing unit 109 performs various types of processing on the image data. Then, the processed image data is recorded as a still image file or a moving image file in a first recording medium 150 or a second recording medium 160.

The radiator fan 107 is a cooling fan. The image capturing apparatus temperature detection unit 106 detects an internal temperature of the image capturing apparatus 100 and notifies the CPU 108 of the detected temperature. The CPU 108 controls the number of rotations of a fan of the radiator fan 107 and adjusts the internal temperature of the image capturing apparatus 100 based on the temperature.

The image capturing apparatus 100 accesses the first recording medium 150 via the first medium control unit 110 and a first medium interface 155 and records still/moving image data having undergone image processing, encoding processing, and compression processing by the image processing unit 109 in the first recording medium 150. The image capturing apparatus 100 reads still/moving image data recorded in the first recording medium 150 via the first medium control unit 110 and the first medium interface 155. The image capturing apparatus 100 displays a video image acquired by decoding read data by the image processing unit 109 on the display unit 104.

The first recording medium 150 is removable from the image capturing apparatus 100. In the present exemplary embodiment, the first recording medium 150 is a memory card that supports the CFexpress standards.

The first medium control unit 110 communicates control commands to a first memory controller 152 via the first medium interface 155. The control commands include a command to record and reproduce data and a command to acquire vender information, temperature information, and information about the number of times of writing.

The first recording medium 150 includes the first memory controller 152, a first NOT-AND (NAND) type memory unit 153, and a first medium temperature detection unit 154. The first memory controller 152, the first NAND type memory unit 153, and the first medium temperature detection unit 154 are connected via an internal bus 151 of the first recording medium 150.

The first memory controller 152 records still/moving image data transferred from the first medium control unit 110 in the first NAND type memory unit 153. The first memory controller 152 controls writing to a cache area of the first NAND type memory unit 153 and moving of data to a main data area. The first memory controller 152 performs garbage collection to move and reduce fragmented data in the first NAND type memory unit 153 to make space available.

The first memory controller 152 acquires the temperature of the first NAND type memory unit 153 that is detected by the first medium temperature detection unit 154. The first memory controller 152 controls clock frequencies to the first NAND type memory unit 153, access inhibition and permission, and access rate based on the acquired temperature.

The second recording medium 160 is connected to the image capturing apparatus 100 via the second medium control unit 111 and a second medium interface 165. The second recording medium 160 has a configuration and function similar to those of the first recording medium 150. A second memory controller 162, a second NAND type memory unit 163, and a second medium temperature detection unit 164 respectively correspond to the first memory controller 152, the first NAND type memory unit 153, and the first medium temperature detection unit 154. The second memory controller 162, the second NAND type memory unit 163, and the second medium temperature detection unit 164 are connected via an internal bus 161 of the second recording medium 160.

In a case where a still image capturing mode is selected by a user operation using the mode selection dial, the image capturing apparatus 100 operates in the still image capturing mode. In the still image capturing mode, the CPU 108 controls the image capturing unit 103 to capture a still image based on an operation on the shutter button and transmits the captured still image data to the image processing unit 109, and the image processing unit 109 performs various types of processing on the still image data. The CPU 108 then generates a still image file based on the processed image data and controls recording to record the still image file in the first recording medium 150 or the second recording medium 160 via the first medium control unit 110 or the second medium control unit 111.

In a case where a moving image capturing mode is selected by a user operation using the mode selection dial, the image capturing apparatus 100 operates in the moving image capturing mode. In the moving image capturing mode, the CPU 108 starts moving image capturing using the image capturing unit 103 based on an operation on the shutter button or a moving image capturing button and continues moving image capturing until the shutter button or the moving image capturing button is operated again. The CPU 108 transmits the captured moving image data to the image processing unit 109, and the image processing unit 109 performs various types of processing on the moving image data. The CPU 108 generates a moving image file based on the processed image data and controls recording to record the moving image file in the first recording medium 150 or the second recording medium 160 via the first medium control unit 110 or the second medium control unit 111.

In a case where a reproduction mode button is operated by a user operation, the image capturing apparatus 100 is changed to a reproduction mode. In the reproduction mode, the CPU 108 controls reproduction so that an image file (still image file, moving image file) recorded in the first recording medium 150 or the second recording medium 160 is read via the first medium control unit 110 or the second medium control unit 111 and is displayed on the display unit 104. In the reproduction mode, as to a still image file, the CPU 108 displays image data of the still image file on the display unit 104. As to a moving image file, the CPU 108 first reads a representative image or a frame image of the first frame of the moving image and displays the read image on the display unit 104, and thereafter, if a user instruction to start moving image reproduction is input, the CPU 108 performs moving image reproduction that continuously reproduces and displays a plurality of frame images of the moving image file.

<HCTM Function of Recording Medium>

There are CFexpress memory cards that can use a host controlled thermal management (HCTM) function. Since the HCTM function is an optional function, there are recording mediums that do not support the HCTM function. As described above, the first memory controller 152 of the first recording medium 150 and the second memory controller 162 of the second recording medium 160 perform function limitation control, such as clock frequency control, access inhibition and permission control, and access rate control, based on temperatures detected by the first medium temperature detection unit 154 and the second medium temperature detection unit 164. In the HCTM function, the first medium control unit 110 and the second medium control unit 111 on the host side can set temperatures as threshold values for execution of function limitation control to the first recording medium 150 and the second recording medium 160.

In HCTM, a first value and a second value (first value<second value) are set as a temperature threshold value setting. In a case where a temperature detected by the first medium temperature detection unit 154 and the second medium temperature detection unit 164 is lower than the first value, the first memory controller 152 and the second memory controller 162 do not perform function limitation control, so that the access rate is not limited and, at the same time, the power consumption is also not limited. Thus, in recording a 4K moving image, a rush current in writing is high. In a case where a temperature detected by the first medium temperature detection unit 154 and the second medium temperature detection unit 164 is greater than or equal to the first value and lower than the second value, the first memory controller 152 and the second memory controller 162 perform function limitation control so that the first recording medium 150 and the second recording medium 160 operate in a first limitation mode in which the power consumption and the writing speed are limited. While the writing speed limitation in the first limitation mode differs for different recording media, writing is often executable in recording of a moving image of about 4K. In a case where a temperature detected by the first medium temperature detection unit 154 and the second medium temperature detection unit 164 is greater than or equal to the second value, the first memory controller 152 and the second memory controller 162 control the first recording medium 150 and the second recording medium 160 to operate in a second limitation mode in which the functions are more limited than the first limitation mode. In the second limitation mode, the power consumption and the writing speed are so limited that writing and reading to and from the first recording medium 150 and the second recording medium 160 are often substantially not executable. In the second limitation mode, the functions are significantly limited (writing and reading are substantially not executable) to thereby decrease the recording medium temperature. As described above, the first medium control unit 110 and the second medium control unit 111 of the image capturing apparatus 100 on the host side control timings to change the first recording medium 150 and the second recording medium 160 supporting the HCTM function to the first limitation mode or the second limitation mode by setting the first value and the second value.

Default values DEFAULT_TMT1 and DEFAULT_TMT2 of the first value and the second value are set for each of the first recording medium 150 and the second recording medium 160. A temperature setting upper limit value MXTMT and a temperature setting lower limit value MNTMT specifying a settable temperature setting range are also set for each of the first recording medium 150 and the second recording medium 160. The first medium control unit 110 and the second medium control unit 111 of the image capturing apparatus 100 use a command to acquire medium capacity information from the first recording medium 150 and the second recording medium 160 so that the image capturing apparatus 100 acquires medium capacity information including the temperature setting upper limit value MXTMT and the temperature setting lower limit value MNTMT set to the first recording medium 150 and the second recording medium 160. Then, the first value and the second value as temperature threshold values for execution of the first limitation mode and the second limitation mode are set within the temperature setting range specified by the temperature setting upper limit value MXTMT and the temperature setting lower limit value MNTMT.

If power is supplied to the first recording medium 150 and the second recording medium 160 to turn on the first recording medium 150 and the second recording medium 160, the first memory controller 152 of the first recording medium 150 and the second memory controller 162 of the second recording medium 160 set the default values DEFAULT_TMT1 and DEFAULT_TMT2 as initial values of the first value and the second value. In a case where the first medium control unit 110 and the second medium control unit 111 of the image capturing apparatus 100 do not set the first value and the second value, the default values DEFAULT_TMT1 and DEFAULT_TMT2 are used. Use of the default values DEFAULT_TMT1 and DEFAULT_TMT2 will be referred to as "HCTM standard use". The first medium control unit 110 and the second medium control unit 111 of the image capturing apparatus 100 use a command relating to the HCTM function so that the first value and the second value can be changed within the range from the temperature setting lower limit value MNTMT to the temperature setting upper limit value MXTMT set to the first recording medium 150 and the second recording medium 160. The first value and the second value are stored in volatile memories of the first recording medium 150 and the second recording medium 160, so that when the first recording medium 150 and the second recording medium 160 are turned off, the first value and the second value are erased, and when the first recording medium 150 and the second recording medium 160 are turned on again, the default values DEFAULT_TMT1 and DEFAULT_TMT2 are set. Setting each of the first value and the second value to a value close to the temperature setting upper limit value MXTMT will be referred to as "HCTM maximal use", in contrast to "HCTM standard use". While the second value is set to the temperature setting upper limit value MXTMT and the first value is set to a temperature that is lower by one degree than the temperature setting upper limit value MXTMT in the HCTM maximal use in the present exemplary embodiment, the temperature setting of the first value and the second value in the HCTM maximal use is not limited to those described above. The first value and the second value are set to values closer to the temperature setting upper limit value MXTMT than those in the HCTM standard use so that even if the temperature rises, the first limitation mode and the second limitation mode are less likely to be executed. The first value in the HCTM maximal use is set greater than the second value in the HCTM standard use so that the first limitation mode and the second limitation mode are less likely to be executed during the HCTM maximal use and performance of the first recording medium 150 and the second recording medium 160 is maximized. In this case, however, the temperature easily rises.

While the first recording medium 150 and the second recording medium 160 in the present exemplary embodiment are memory cards that support the CFexpress standards, the present exemplary embodiment is applicable to recording media of different standards that include a function similar to the HCTM function of the CFexpress standards by which a function limitation temperature to a recording medium can be set from a host apparatus.

<Process for Using HCTM Function>

Figure 2:
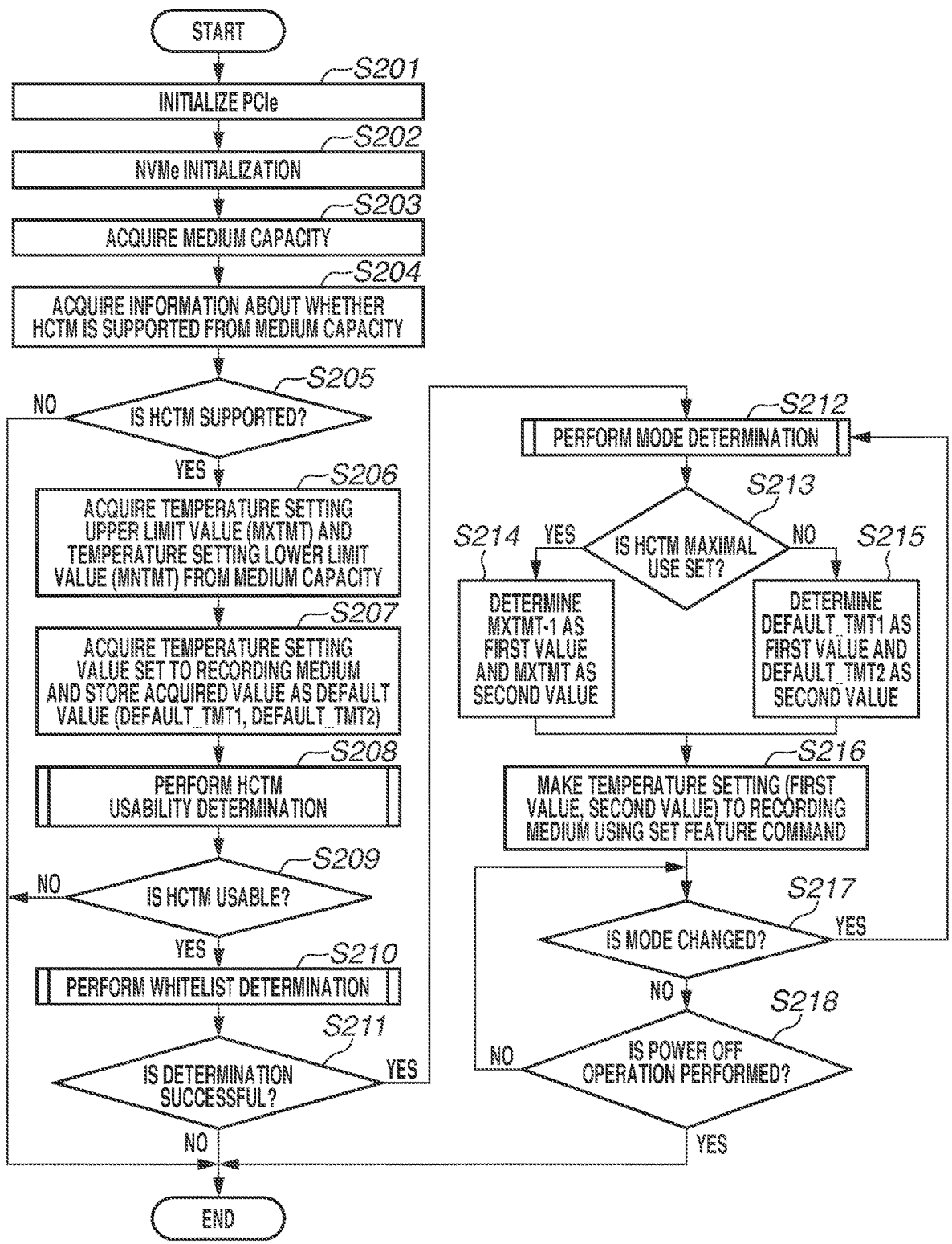
FIG. 2 is a flowchart illustrating a process for using a host controlled thermal management (HCTM) function executed by the image capturing apparatus 100.

FIG. 2 is a flowchart illustrating a process for using the HCTM function executed by the image capturing apparatus 100. The CPU 108 executes a control program stored in the non-volatile memory 113 and controls the components of the image capturing apparatus 100. While the flowchart illustrates a process relating to the first recording medium 150, other types of processing such as image capturing processing, image reproduction processing, captured image and menu screen display processing, and menu setting processing are also performed. While the flowchart illustrates a process on the first recording medium 150, a similar process is also performed on the second recording medium 160.

The process illustrated in the flowchart is executed at the press of the power button to turn on the image capturing apparatus 100.

In step S201, the first medium control unit 110 performs Peripheral Component Interconnect Express (PCIe) bus initialization on the first recording medium 150. In the present exemplary embodiment, commands in the physical layer level are exchanged between the first medium control unit 110 of the image capturing apparatus 100 on the host side and the first recording medium 150, and the first recording medium 150 is activated and turned on. Then, in step S202, the first medium control unit 110 performs Non-Volatile Memory Express (NVMe) initialization and activation processing including submission and completion queues. In step S202, initialization for a software level protocol is performed, different from the physical layer level initialization in step S201.

Next, in step S203, the first medium control unit 110 issues an identify command to acquire details of the capacity (medium capacity information) of the first recording medium 150. The identify command is a command to acquire basic information such as commands and functions supported by the first recording medium 150. Examples of capacity information acquired using the command are a model name, firmware version, information about whether a specific command or function is supported, the number of low power consumption modes, and specific power consumption values. Then, in step S204, the CPU 108 analyzes information about whether HCTM is supported from the capacity information about the first recording medium 150 that is acquired using the identify command in step S203. Then, in step S205, the CPU 108 determines whether the first recording medium 150 supports HCTM based on the analysis in step S204. In a case where the CPU 108 determines that the first recording medium 150 supports HCTM (YES in step S205), the processing proceeds to step S206 of a sequence of recording medium control using the HCTM function. In a case where the CPU 108 determines that the first recording medium 150 does not support HCTM (NO in step S205), the process illustrated in the flowchart ends, and a process for a recording medium that does not use the HCTM function is performed.

In step S206, the CPU 108 acquires current values of the temperature setting upper limit value MXTMT and the temperature setting lower limit value MNTMT of the first recording medium 150 from the medium capacity information acquired in step S203. The temperature setting upper limit value MXTMT and the temperature setting lower limit value MNTMT are values that are effective only in a case where HCTM is supported, and specify upper and lower limit values of temperature values (the first value, the second value) that are settable from the host. Specifically, in step S206, a range of settable temperature setting values is acquired. The CPU 108 stores the acquired values of the temperature setting upper limit value MXTMT and the temperature setting lower limit value MNTMT in the RAM 112.

Next, in step S207, the first medium control unit 110 issues a get feature command, which is a command to acquire detailed function information. The get feature command is a command to acquire information about the first recording medium 150, and information different from the information acquired by the identify command is acquired. The get feature command is a command to acquire more detailed information than the information acquired by the identify command. With the get feature command, setting temperatures (the first value, the second value) in the HCTM function that are currently set to the first recording medium 150 are acquired. The acquired setting temperatures are values acquired immediately after the first recording medium 150 is turned on without changing the temperature setting, so that the acquired setting temperatures are default values set to the first recording medium 150. Specifically, the default values of the threshold values (the first value, the second value) of the temperature setting of the first recording medium 150 are acquired. The CPU 108 stores the acquired first value as a default value DEFAULT_TMT1 and the acquired second value as a default value DEFAULT_TMT2 in the RAM 112.

Next, in step S208, the CPU 108 performs HCTM usability determination. Details of the HCTM usability determination will be described below with reference to FIG. 3. Since HCTM is not a mandatory function but an optional function, there are recording mediums that do not support HCTM. Since the function has no advantages to a recording medium vender, precise vender inspection may not be performed in advance as in a case of a suspend address command of the Video Speed Class standards. For this reason, in step S208, whether the temperature setting upper limit value MXTMT and the temperature setting lower limit value MNTMT acquired in step S206 and the HCTM default values DEFAULT_TMT1 and DEFAULT_TMT2 acquired in step S207 are valid are checked, and whether to use the HCTM function is determined based on the check results. Then, in step S209, in a case where the CPU 108 determines that HCTM is usable as a result of the determination in step S208 (YES in step S209), the processing proceeds to step S210. In a case where the CPU 108 determines that HCTM is not usable as a result of the determination in step S208 (NO in step S209), the process illustrated in the flowchart ends, and the process for a recording medium that does not use the HCTM function is performed.

In step S210, the CPU 108 performs whitelist determination. Details of the whitelist determination will be described below with reference to FIG. 4. In step S211, in a case where the whitelist determination in step S210 is successful (YES in step S211), the processing proceeds to step S212. In a case where the whitelist determination is unsuccessful (NO in step S211), the process illustrated in the flowchart ends, and the process for a recording medium that does not use the HCTM function is performed.

In step S212, the CPU 108 performs mode determination. Details of the mode determination will be described below with reference to FIG. 5. The current operation mode of the image capturing apparatus 100 is determined by the mode determination, and whether to execute "HCTM standard use" or "HCTM maximal use" is determined based on the determined operation mode. As described above, in "HCTM standard use", the default values DEFAULT_TMT1 and DEFAULT_TMT2 acquired in step S207 are directly used, whereas in "HCTM maximal use", a value based on the temperature setting upper limit value MXTMT acquired in step S206 are used. A temperature at which the first recording medium 150 is changed to the first limitation mode and a temperature at which the first recording medium 150 is changed to the second limitation mode are selected based on the operation mode of the image capturing apparatus 100 as described above. In an operation mode that does not require speed, the HCTM standard use using the default values DEFAULT_TMT1 and DEFAULT_TMT2 is executed to prevent an excessive temperature rise. In an operation mode that requires speed, the HCTM maximal use is executed so that performance of the first recording medium 150 is exerted continuously up to a temperature higher than that in the case where the HCTM standard use is executed.

In step S213, the CPU 108 determines whether the HCTM maximal use is set as a result of the mode determination in step S212. In a case where the HCTM maximal use is set (YES in step S213), the processing proceeds to step S214. In step S214, the CPU 108 determines the temperature setting upper limit value MXTMT as the second value and a value MXTMT-1 as the first value as the HCTM temperature setting made to the first recording medium 150. In the present exemplary embodiment, the first value is set to the value MXTMT-1, which is lower by one degree than the temperature setting upper limit value MXTMT. The first value in the HCTM maximal use does not have to be the value MXTMT-1 and can be set to another value greater than the default value DEFAULT_TMT1 based on an operation condition and a heat rise curve.

In step S213, in a case where the CPU 108 determines that not the HCTM maximal use but the HCTM standard use is set as a result of the mode determination in step S212 (NO in step S213), the processing proceeds to step S215. In step S215, the CPU 108 determines the HCTM temperature setting made to the first recording medium 150 as default values. Specifically, the CPU 108 determines the default value DEFAULT_TMT1 as the first value and the default value DEFAULT_TMT2 as the second value. While the default values DEFAULT_TMT1 and DEFAULT_TMT2 of the first recording medium 150 are used in the HCTM standard use in the present exemplary embodiment, in a case where there are other index values, the index values can be employed instead of the default values DEFAULT_TMT1 and DEFAULT_TMT2. Even in a case where the default values DEFAULT_TMT1 and DEFAULT_TMT2 are not used, the first value in the HCTM standard use is smaller than the first value in the HCTM maximal use, and the second value in the HCTM standard use is smaller than the second value in the HCTM maximal use.

Next, in step S216, the CPU 108 and the first medium control unit 110 perform a process of setting the temperature threshold values (the first value, the second value) of the HCTM function that are determined in step S214 or S215 to the first recording medium 150 using a detailed function setting command referred to as "set feature command" Specifically, the first value and the second value determined in step S214 or S215 are set as arguments for setting the HCTM temperature threshold values in the set feature command, and the set feature command is issued to the first recording medium 150. In step S216, the temperature threshold values are set to thereby change the temperature threshold values for execution of the first limitation mode and the second limitation mode in the first recording medium 150.

In step S217, the CPU 108 determines whether the operation mode of the image capturing apparatus 100 is changed. In a case where the operation mode is changed (YES in step S217), the processing returns to step S212. In a case where the operation mode is not changed (NO in step S217), the processing proceeds to step S218. If a user operates the mode selection dial of the image capturing apparatus 100, the operation mode is changed to the still image capturing mode or the moving image capturing mode. If a reproduction button is operated, the operation mode is changed to the reproduction mode. If the menu button is operated, the operation mode is changed to a setting mode in which a setting screen is displayed on the display unit 104 to make various settings based on a user operation. Operation mode changes in the present exemplary embodiment include not only changes to the still image capturing mode, the moving image capturing mode, the reproduction mode, and the setting mode but also a change of a reproduction target image during the reproduction mode and a change of an operation state of the image capturing apparatus 100 such as execution of a specific function such as a function of copying image data between media. Thus, in step S217, a change of the operation state is also determined as a change of the operation mode, and steps S212 to S216 are performed with respect to the changed operation mode. Specifically, steps S212 to S216 are repeated each time the operation mode is changed In step S218, the CPU 108 determines whether a power-off operation is performed. In a case where a power-off operation is performed (YES in step S218), the process ends, and a power-off process is performed. In a case where a power-off operation is not performed (NO in step S218), the processing returns to step S217.

Figure 3:
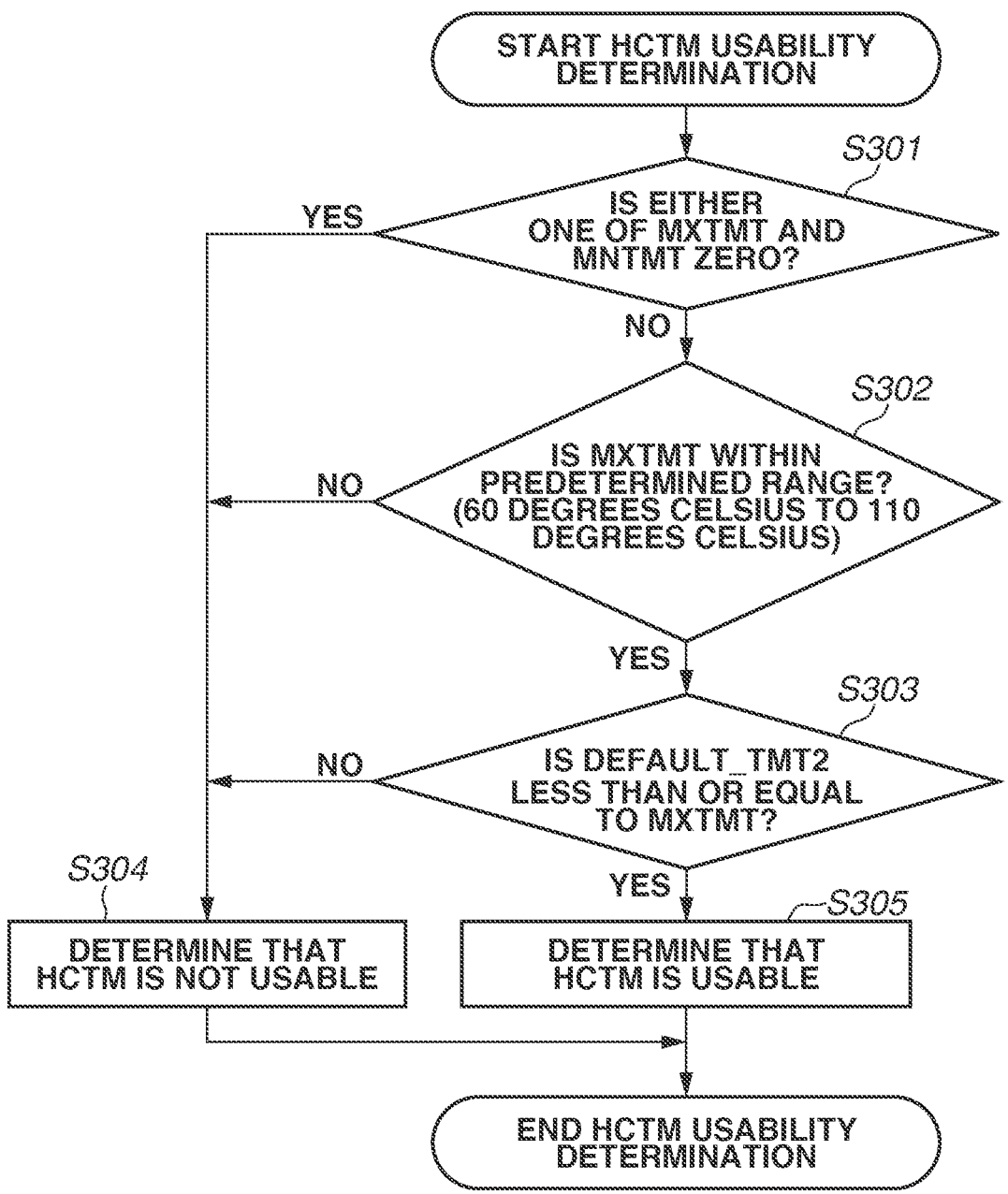
FIG. 3 is a flowchart illustrating a HCTM usability determination process.

Details of the HCTM usability determination processing in step S208 in FIG. 2 will be described below with reference to FIG. 3.

First, in step S301, the CPU 108 checks whether each of the temperature setting upper limit value MXTMT and the temperature setting lower limit value MNTMT acquired in step S206 is zero. In a case where the temperature setting upper limit value MXTMT or the temperature setting lower limit value MNTMT is zero degrees Celsius although HCTM is supported, it is considered that zero as an initial value is set because no values are set by the vender, instead of considering that the values are really zero degrees Celsius. In a case where each of the temperature setting upper limit value MXTMT and the temperature setting lower limit value MNTMT is not zero (NO in step S301), the processing proceeds to step S302. In a case where the temperature setting upper limit value MXTMT or the temperature setting lower limit value MNTMT is zero (YES in step S301), the processing proceeds to step S304. In step S304, the CPU 108 determines that HCTM is not usable. In in the present exemplary embodiment, it is determined that HCTM is not usable in a case where either the temperature setting upper limit value MXTMT or the temperature setting lower limit value MNTMT is zero. Alternatively, it can be determined that HCTM is not usable in a case where both the temperature setting upper limit value MXTMT and the temperature setting lower limit value MNTMT is zero.

In step S302, the CPU 108 determines whether the temperature setting upper limit value MXTMT is within a predetermined range in order to check the validity of the temperature setting upper limit value MXTMT. Specifically, in a case where the temperature setting upper limit value MXTMT is in the range of 60 degrees Celsius to 110 degrees Celsius, it is determined that the temperature setting upper limit value MXTMT is valid. While the temperature range determined as valid is preset to the range of 60 degrees Celsius to 110 degrees Celsius in the present exemplary embodiment, the temperature range is not limited to this temperature range. In a case where the temperature setting upper limit value MXTMT is in the temperature range of 60 degrees Celsius to 110 degrees Celsius (YES in step S302), the processing proceeds to step S303. In a case where the temperature setting upper limit value MXTMT is outside the temperature range (NO in step S302), the processing proceeds to step S304. In step S304, the CPU 108 determines that HCTM is not usable.

In step S303, the CPU 108 compares the default value DEFAULT_TMT2 corresponding to the second value from among the default values acquired in step S207 with the temperature setting upper limit value MXTMT acquired in step S206. In a case where the default value DEFAULT_TMT2 set as the default value of the second value to the first recording medium 150 is greater than the temperature setting upper limit value MXTMT, the default value DEFAULT_TMT2 or the temperature setting upper limit value MXTMT set to the first recording medium 150 is not an appropriate value. Thus, in the case where the default value DEFAULT_TMT2 is greater than the temperature setting upper limit value MXTMT (NO in step S303), the processing proceeds to step S304. In step S304, the CPU 108 determines that HCTM is not usable. In a case where the default value DEFAULT_TMT2 is less than or equal to the temperature setting upper limit value MXTMT (YES in step S303), the processing proceeds to step S305. In step S305, the CPU 108 determines that HCTM is usable.

While whether HCTM is usable is determined by the checks in steps S301, S302, and S303 in the present exemplary embodiment, another type of determination can be performed. For example, the temperature setting upper limit value MXTMT can be compared with the temperature setting lower limit value MNTMT, and in a case where the temperature setting upper limit value MXTMT is less than the temperature setting lower limit value MNTMT, the CPU 108 determines that HCTM is not usable.

The whitelist determination processing will now be described with reference to FIG. 4. Prior to the determination, reliable recording medium information (whitelist) is stored in the image capturing apparatus 100. While a model name is described as a specific example of information that is stored in the present exemplary embodiment, information that is stored is not limited to the model name, and a vender ID acquired via PCIe physical layer communication can be used.

In step S401, the CPU 108 analyzes the medium capacity information acquired in step S203 and acquires a model name Next, in step S402, the CPU 108 collates the acquired model name with the internally held information. In step S403, the CPU 108 determines whether the model name acquired in step S401 is contained in the internally held information (whether there is a hit). In a case where there is not a hit (NO in step S403), in step S404, the CPU 108 determines that the whitelist determination is unsuccessful. In a case where the model name is contained in the internally held information (YES in step S403), in step S405, the CPU 108 determines that the whitelist determination is successful, and the whitelist determination process ends.

Details of the mode determination processing will now be described with reference to FIG. 5. In step S501, the CPU 108 determines whether the current operation mode of the image capturing apparatus 100 is the still image capturing mode. In a case where the CPU 108 determines that the current operation mode is the still image capturing mode (YES in step S501), the processing proceeds to step S506. Otherwise (NO in step S501), the processing proceeds to step S502, and the next determination is performed. In step S502, the CPU 108 determines whether the current operation mode of the image capturing apparatus 100 is the moving image capturing mode. In a case where the CPU 108 determines that the current operation mode is the moving image capturing mode (YES in step S502), the processing proceeds to step S506. Otherwise (NO in step S502), the processing proceeds to step S503, and the next determination is performed. In step S503, the CPU 108 determines whether the current operation mode of the image capturing apparatus 100 is the reproduction mode. In a case where the CPU 108 determines that the current operation mode is the reproduction mode (YES in step S503), in step S504, the CPU 108 determines whether the mode change operation detected in step S217 is an operation on a moving image reproduction button to input a moving image reproduction instruction. In a case where the detected operation is a moving image reproduction instruction (YES in step S504), the processing proceeds to step S506. In a case where the detected operation is not a moving image reproduction instruction but an operation other than an operation for moving image reproduction, such as an operation for changing to the reproduction mode, an operation for still image reproduction, or an operation for reproduction of an image of a single frame in a moving image file (NO in step S504), the processing proceeds to step S505. In a case where a reproduction target image is changed (switched) in the reproduction mode, a next still image or a representative image (only an image of the first frame) of a next moving image is reproduced. Thus, also in the case where a reproduction target image is changed, the processing proceeds to step S505. In step S503, in a case where the CPU 108 determines that the current operation mode is not the reproduction mode (NO in step S503), the processing proceeds to step S505. In step S505, the CPU 108 determines to set the HCTM standard use. In step S506, the CPU 108 determines to set the HCTM maximal use. As described above, in the present exemplary embodiment, whether to set the HCTM standard use or the HCTM maximal use is determined based on the operation mode and the operation state of the image capturing apparatus 100.

In the present exemplary embodiment, the HCTM maximal use is set in a case where the operation mode is changed to the still image capturing mode, the operation mode is changed to the moving image capturing mode, or moving image reproduction is performed in the reproduction mode. The HCTM standard use is set in the other modes (setting mode, still image reproduction in the reproduction mode). In the still image capturing mode and the moving image capturing mode, the HCTM maximal use is set to maximize the recording medium performance so that a user-intended timing or opportunity to capture an image will not be missed.

In moving image reproduction, if an underflow situation occurs in which moving image reading is late with respect to reproduction intervals, moving image reproduction is stopped. Thus, the HCTM maximal use is set so that the recording medium performance is maximized, although there can be some temperature rise.

The HCTM standard use is set in still image reproduction and simultaneous reproduction of a plurality of thumbnail images in the reproduction mode and the setting mode. In a case where only a single frame image (only a representative image or a selected frame) of a moving image file is to be reproduced even in moving image file reproduction in the reproduction mode, the HCTM standard use is set as in the case of still image reproduction. In a case where a raw image development function, a recording medium initialization function, a function of copying image data between a plurality of media, or a moving image cutting/editing function is to be executed as a function of the image capturing apparatus 100, the HCTM standard use is set because there are no time constraints and the recording medium performance does not have to be maximized. In a case where the raw image development function, the function of copying image data between a plurality of media, or the moving image cutting/editing function is executed on image data having a large data size, the temperature can increase by 20 degrees Celsius to 25 degrees Celsius. Thus, instead of the HCTM maximal use in which a temperature rise often occurs, the HCTM standard use in which a temperature rise is more prevented than the HCTM maximal use is set.

In the present exemplary embodiment, whether the operation mode is the still image capturing mode, whether the operation mode is the moving image capturing mode, and whether a moving image is to be reproduced are determined, and in the foregoing cases, the HCTM maximal use is set, whereas in other cases, the HCTM standard use is set. The present exemplary embodiment is not limited to above description, and other possible modified examples are applicable. For example, the still image capturing mode and the moving image capturing mode are not separately determined, and in an image capturing mode, the HCTM maximal use can be set. In moving image reproduction, whether the recording medium performance is to be maximized to reproduce a moving image is determined based on a bit rate of the moving image, and in a case where the moving image has a high bit rate, the HCTM maximal use can be set, whereas in a case where the moving image has a low bit rate, the HCTM standard use can be set.

As described above, in the present exemplary embodiment, in step S217, the CPU 108 monitors a change in the operation mode and the operation state that relates to a change of the HCTM standard use or the HCTM maximal use, and in a case where such a change is made, whether to set the HCTM standard use or the HCTM maximal use is determined by the mode determination processing. Then, in step S216, the first value and the second value corresponding to the determined one of the HCTM standard use and the HCTM maximal use are set, and the temperature threshold values in the HCTM function of a recording medium are changed. Step S216 can be skipped in a case where the setting before the change and the setting after the change are the same.

In a case where the operation mode is changed, processing in the operation mode (operation state) can be started after the temperature threshold value setting for the HCTM standard use or the HCTM maximal use is changed, or processing in the operation mode can be performed simultaneously with the changing of the temperature threshold value setting. In moving image reproduction, it is desirable to start moving image reproduction processing after the temperature threshold value setting is changed.

Other Embodiments

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While exemplary embodiments have been described, it is to be understood that these exemplary embodiments are not seen to be limiting. The scope of the following claims is to be accorded the broadest interpretation so as to encompass all such modifications and equivalent structures and functions.

This application claims the benefit of Japanese Patent Application No. 2019-217575, filed Nov. 29, 2019, and Japanese Patent Application No. 2019-217576, filed Nov. 29, 2019, which are hereby incorporated by reference herein in their entirety.

What is claimed is:

1. A recording apparatus configured to access a recording medium, the recording apparatus comprising:
an image capturing device;
a recording controller configured to record an image captured by the image capturing device in the recording medium;
a reproduction controller configured to read the image recorded in the recording medium and reproduce the read image; and
a controller configured to set a temperature threshold value for execution of function limitation on the recording medium to the recording medium,
wherein the controller selects, based on an operation state of the recording apparatus, whether to execute a first setting to set the temperature threshold value to a specific value or a second setting to set the temperature threshold value to a value greater than the specific value, and
wherein in a capturing mode in which the image capturing device captures an image, the controller performs control to execute the second setting, whereas in still image reproduction in which a still image recorded in the recording medium is reproduced, the controller performs control to execute the first setting.

2. The recording apparatus according to claim 1, wherein in a reproduction mode in which the image recorded in the recording medium is read and reproduced, the controller performs control to execute the first setting in still image reproduction in which a still image is reproduced, whereas the controller performs control to execute the second setting in moving image reproduction in which a moving image is reproduced.

3. The recording apparatus according to claim 2, wherein in a case where a moving image file recorded in the recording medium is to be reproduced, the controller performs control to execute the first setting in a case where a single frame image in the moving image file is to be reproduced, whereas the controller performs control to execute the second setting in a case where a plurality of frames in the moving image file is to be reproduced continuously.

4. The recording apparatus according to claim 1, wherein the controller sets a first value and a second value greater than the first value being a temperature threshold value for execution of a first limitation mode on the recording medium, the second value being a temperature threshold value for execution of a second limitation mode, which places more limitation than the first limitation mode, on the recording medium.

5. The recording apparatus according to claim 4, further comprising a range acquisition circuit configured to acquire a settable value range of the temperature threshold value for execution of function limitation on the recording medium from the recording medium,
wherein the controller sets the first value and the second value within the settable value range acquired by the range acquisition circuit.

6. The recording apparatus according to claim 5, wherein in the second setting, the controller sets an upper limit value in the settable value range as the second value and sets a value less than the second value and greater than the second value in the first setting as the first value.

7. The recording apparatus according to claim 6, wherein in the second setting, the controller sets a value less by one value amount than the upper limit value in the settable value range as the first value.

8. The recording apparatus according to claim 1, wherein the specific value is a default value of the recording medium.

9. The recording apparatus according to claim 8, further comprising a default value acquisition circuit configured to acquire a default value of the temperature threshold value for execution of function limitation on the recording medium from the recording medium,
   wherein the default value acquisition circuit acquires a temperature threshold value set to the recording medium before a setting of the temperature threshold value for execution of function limitation on the recording medium is changed, and wherein the default value acquisition circuit determines the acquired temperature threshold value as the default value.

10. The recording apparatus according to claim 1,
   wherein the recording medium is a memory card supporting a CFexpress standard, and
   wherein the controller sets the temperature threshold value using a host controlled thermal management (HCTM) function.

11. A recording apparatus configured to access a recording medium, the recording apparatus comprising: a determination circuit configured to determine whether the recording medium supports a predetermined function by which the recording apparatus sets the temperature threshold value for execution of function limitation on the recording medium; and an acquisition circuit configured to acquire information about an upper limit value or a lower limit value of a settable value range that can be set in the recording medium as the temperature threshold value in a case where the determination circuit determines that the recording medium supports the predetermined function; and a controller configured to set a temperature threshold value for execution of function limitation on the recording medium in the predetermined function to the recording medium, wherein the controller switches whether or not to use the predetermined function based on the upper limit value or the lower limit value of the settable value range of the temperature threshold value acquired by the acquisition circuit.

12. The recording apparatus according to claim 11,
   wherein the controller performs control not to use the predetermined function in a case where an upper limit value or a lower limit value of the settable value range acquired by the acquisition circuit is zero.

13. The recording apparatus according to claim 11,
   wherein the controller performs control not to use the predetermined function in a case where an upper limit value and a lower limit value of the settable value range acquired by the acquisition circuit is zero.

14. The recording apparatus according to claim 11,
   wherein the acquisition circuit acquires an upper limit value of a value settable as the temperature threshold value, and
   wherein the controller performs control not to use the predetermined function in a case where the upper limit value acquired by the acquisition circuit is outside a predetermined range.

15. The recording apparatus according to claim 11,
   wherein the acquisition circuit acquires an upper limit value of a value settable as the temperature threshold value and acquires a default value of the temperature threshold value that is initially set to the recording medium, and
   wherein the controller performs control not to use the predetermined function in a case where the default value is greater than the upper limit value.

16. A method of controlling a recording apparatus configured to access a recording medium, the method comprising:
   recording an image captured by an image capturing device in the recording medium;
   reading the image recorded in the recording medium and reproducing the read image; and
   performing control to set a temperature threshold value for execution of function limitation on the recording medium to the recording medium,
   wherein based on an operation state of the recording apparatus, the control includes, selecting whether to execute a first setting to set the temperature threshold value to a specific value or a second setting to set the temperature threshold value to a value greater than the specific value, and
   wherein in a capturing mode in which the image capturing device captures an image, the control selects to execute the second setting, whereas in still image reproduction in which a still image recorded in the recording medium is reproduced, the control selects to execute the first setting.

17. The method according to claim 16, wherein the specific value is a default value of the recording medium.

18. A non-transitory computer-readable storage medium storing a program that causes a computer to execute a method of controlling a recording apparatus configured to access a recording medium, the method comprising:
   recording an image captured by an image capturing device in the recording medium;
   reading the image recorded in the recording medium and reproducing the read image; and
   performing control to set a temperature threshold value for execution of function limitation on the recording medium to the recording medium,
   wherein, based on an operation state of the recording apparatus, the control includes selecting whether to execute a first setting to set the temperature threshold value to a specific value or a second setting to set the temperature threshold value to a value greater than the specific value, and
   wherein in a capturing mode in which the image capturing device captures an image, the control selects to execute the second setting, whereas in still image reproduction in which a still image recorded in the recording medium is reproduced, the control selects to execute the first setting.

19. A method of controlling a recording apparatus configured to access a recording medium, the method comprising:
   determining whether the recording medium supports a predetermined function by which the recording apparatus sets the temperature threshold value for execution of function limitation on the recording medium;
   acquiring information about an upper limit value or a lower limit value of a settable value range that can be set in the recording medium as the temperature threshold value in a case where it is determined that the recording medium supports the predetermined function in the determining; and
   setting a temperature threshold value for execution of function limitation on the recording medium in the predetermined function to the recording medium,
   wherein in the setting, whether or not to use the predetermined function is switched based on the upper limit value or the lower limit value of the settable value range of the temperature threshold value acquired in the acquiring.

20. A non-transitory computer-readable storage medium storing a program that causes a computer to execute a method of controlling a recording apparatus configured to access a recording medium, the method comprising:

determining whether the recording medium supports a predetermined function by which the recording apparatus sets the temperature threshold value for execution of function limitation on the recording medium;

acquiring information about an upper limit value or a lower limit value of a settable value range that can be set in the recording medium as the temperature threshold value in a case where it is determined that the recording medium supports the predetermined function in the determining; and setting a temperature threshold value for execution of function limitation on the recording medium in the predetermined function to the recording medium, wherein in the setting, whether or not to use the predetermined function is switched based on the upper limit value or the lower limit value of the settable value range of the temperature threshold value acquired in the acquiring.

* * * * *